United States Patent
Shibata

(10) Patent No.: US 6,835,593 B2
(45) Date of Patent: Dec. 28, 2004

(54) METHOD FOR MANUFACTURING SEMICONDUCTOR DEVICE

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/629,904

(22) Filed: Jul. 30, 2003

(65) Prior Publication Data

US 2004/0137708 A1 Jul. 15, 2004

(30) Foreign Application Priority Data

Aug. 1, 2002 (JP) ........................................ 2002-225097
Aug. 13, 2002 (JP) ........................................ 2002-236036

(51) Int. Cl.[7] .............................................. H01L 21/50
(52) U.S. Cl. ........................ 438/106; 438/108; 438/119
(58) Field of Search ................................ 438/106, 108, 438/119

(56) References Cited

U.S. PATENT DOCUMENTS 5,878,942 A * 3/1999 Kodama et al. ......... 228/180.22
6,103,549 A * 8/2000 Master et al. ............... 438/106
6,551,854 B2 * 4/2003 Hosomi et al. ............. 438/106
2002/0090756 A1 * 7/2002 Tago et al. .................. 438/108
2003/0096453 A1 * 5/2003 Wang et al. ................. 438/108

* cited by examiner

Primary Examiner—Trung Dang
(74) Attorney, Agent, or Firm—Rabin & Berdo, P.C.

(57) ABSTRACT

A method for manufacturing a semiconductor device by bonding a first metal bump formed on a first semiconductor substrate and a second metal bump formed on a second semiconductor substrate together. This method includes a low melting point metal layer forming step for forming a layer of a low melting point metal on a top portion of at least either of the first metal bump and the second metal bump, a substrate temperature controlling step for controlling, with the first semiconductor substrate and the second semiconductor substrate being separated from each other, the temperature of the first semiconductor substrate to a first temperature higher than the solidus temperature of the low melting point metal and controlling the temperature of the second semiconductor substrate to a second temperature lower than the solidus temperature of the low melting point metal, a metal bump approaching step for bringing the first metal bump and second metal bump close to each other after the substrate temperature controlling step, and a step for controlling, after the metal bump approaching step, the temperatures of the first semiconductor substrate and the second semiconductor substrate to a temperature lower than the solidus temperature of the low melting point metal.

11 Claims, 6 Drawing Sheets

US 6,835,593 B2

METHOD FOR MANUFACTURING SEMICONDUCTOR DEVICE

BACKGROUND OF THE INVENTION

1. Field of the Invention

The present invention relates to a method for manufacturing semiconductor device having a Chip-On-Chip structure in which a semiconductor chip is bonded onto another semiconductor chip.

2. Description of Related Art

One form of so-called a multi-chip type semiconductor device has a Chip-On-Chip structure in which a plurality of semiconductor chips are stacked. In a semiconductor device having a Chip-On-Chip structure, a sub-chip smaller than a main chip is bonded onto a surface of the main chip connected to outside. In some cases, a plurality of sub-chips are bonded onto a main chip.

Each of the main chip and the sub-chip has a plurality of metal bumps on its active surface provided with functional elements and wirings thereon. These metal bumps are mainly formed of a high melting point metal such as gold (Au), and a layer of a low melting point metal such as tin (Sn) is formed on each of the top portions of both or either of metal bumps of the main chip and the metal bumps of the sub-chip.

In a first conventional method for manufacturing a semiconductor device having a Chip-On-Chip structure, the active surface of the main chip and the active surface of the sub-chip are opposed to each other and the main chip and the sub-chip are heated to a temperature higher than the melting point (solidus temperature) of the low melting point metal. Thereby, the low melting point metal layers formed on the top portions of the metal bumps melt. Thereafter, the metal bumps of the main chip and the metal bumps of the sub-chip are positioned with respect to each other and brought close to (into contact with) each other, and the main chip and the sub-chip are cooled to a temperature lower than the melting point of the low melting point metal. As a result, the low melting point metal solidifies, and the metal bumps of the main chip and the metal bumps of the sub-chip are electrically and mechanically bonded together through the low melting point metal.

In a second conventional method for manufacturing a semiconductor device having a Chip-On-Chip structure, a load is applied on the main chip and the sub-chip so that the metal bumps of the main chip and the metal bumps of the sub-chip can be pressed against each other, and then the main chip and the sub-chip are heated to a temperature higher than the melting point (solidus temperature) of the low melting point metal. Thereby, the low melting point metal layers formed on the top portions of the metal bumps respectively melt. Thereafter, the main chip and the sub-chip are cooled to a temperature lower than the melting point of the low melting point metal. As a result, the low melting point metal solidifies, and the metal bumps of the main chip and the metal bumps of the sub-chip are electrically and mechanically bonded together through the low melting point metal.

In this case, if oxide films are formed on the surfaces of the metal bumps of the main chips and the metal bumps of the sub-chips, the oxide films are broken by pressing the metal bumps of the main chip and the metal bumps of the sub-chips against each other, so that the metal bumps of the main chip and the metal bumps of the sub-chip can be suitably bonded through the low melting point metal.

The abovementioned bonding may be carried out with the use of, instead of the main chip, a wafer before main chips are cut out therefrom. In this case, after the semiconductor wafer and the sub-chips are bonded together, the semiconductor wafer is cut into pieces of semiconductor chips each having a Chip-On-Chip structure.

However, in the abovementioned first manufacturing method, when the metal bumps of the main chip and the metal bumps of the sub-chips are brought close to each other, the molten low melting point metal is pushed out from between the metal bumps of the main chip and the metal bumps of the sub-chips respectively and flow sideways. Thereby, adjacent metal bumps are electrically short-circuited in an extreme case.

Further, in the case of carrying out such bonding using a semiconductor wafer instead of a main chip according to the abovementioned method, a number of (e.g. thousands of) sub-chips are bonded onto the semiconductor wafer. Consequently, the wafer and the sub-chips are in the overheated state to a high temperature for a long time till all of the sub-chips are bonded. Thereby, the characteristics of the main chips and the sub-chips are degraded.

Further, a semiconductor wafer has a number of (thousands of) regions each corresponding to a main chip, and therefore, it is impossible to press sub-chips against all of the regions each corresponding to a main chip at one time and heat them. Therefore, in the abovementioned second manufacturing method, it is necessary to transfer a sub-chip to a predetermined position above the semiconductor wafer by means of a vacuum collet, heat and cool the same with applying a load on the sub-chip and repeat these steps as many times as the number of the sub-chips. This results in a low productivity.

Further, at the time of bonding the main chip and the sub-chip together, the metal bumps of the main chip and the metal bumps of the sub-chip are required to be accurately positioned with respect each other. However, a device used for bonding gets out of order because of its heat history accompanied by heating and cooling, so that the accuracy of the positioning cannot be made high.

Furthermore, at the time of bonding the main chip and the sub-chip, for example, if the sub-chip are electrically charged, the functional elements on the main chip are electrostatically damaged by electric discharge from the sub-chip when the metal bumps of the main chip and the metal bumps of the sub-chip come into contact with each other. In order to prevent such damage from occurring, the main chip is provided with a protective diode connected to the metal bumps. However, such a protective diode in itself is unnecessary, and if such a protective diode is provided, the area used for forming other functional elements is reduced.

SUMMARY OF THE INVENTION

An object of the present invention is to provide a method for manufacturing a semiconductor device capable of suitably bonding together metal bumps formed on a first semiconductor substrate and metal bumps formed on a second semiconductor substrate respectively.

Another object of the present invention is to provide a method for manufacturing a semiconductor device in which characteristics of the semiconductor substrates are hard to be degraded.

A further object of the present invention is to provide a method for manufacturing a semiconductor device having a high productivity.

A further object of the present invention is to provide a method for manufacturing a semiconductor device capable of bonding a plurality of semiconductor substrates with reducing unalignment or displacement thereof.

A further object of the present invention is to provide a method for manufacturing a semiconductor device in which it is unnecessary to provide a protective diode on a semiconductor substrate for preventing electrostatic damage from occurring at the time of bonding a plurality of semiconductor substrates.

A method for manufacturing a semiconductor device according to a first aspect of the present invention is a method for manufacturing a semiconductor device by bonding a first metal bump formed on a first semiconductor substrate and a second metal bump formed on a second semiconductor substrate. This method includes a low melting point metal layer forming step for forming a low melting point metal layer on a top portion of at least either of the first metal bump and the second metal bump, a substrate temperature controlling step for, with the first semiconductor substrate and the second semiconductor substrate being separated from each other, controlling the temperature of the first semiconductor substrate to a first temperature higher than a solidus temperature of the low melting point metal and controlling the temperature of the second semiconductor substrate to a second temperature lower than a solidus temperature of the low melting point metal, a metal bump approaching step for bringing the first metal bump and the second metal bump close to each other after the substrate temperature controlling step, and a step for controlling, after the metal bump approaching step, the temperatures of the first semiconductor substrate and the second semiconductor substrate to a temperature lower than the solidus temperature of the low melting point metal.

According to the present invention, for example, in a case that a low melting point metal layer is formed on the first metal bump, a melt of the low melting point metal is produced at the substrate temperature controlling step. On the other hand, at the substrate temperature controlling step, the temperature of the second metal bump is controlled to be lower than the solidus temperature of the low melting point metal. At the metal bump approaching step, the low melting point metal layer comes into contact with the second metal bump, the melt of the low melting point metal is cooled and solidifies. When cooled, the melt of the low melting point metal is hard to flow if it does not completely solidify.

Therefore, the melt of the low melting point metal does not flow from between the first metal bump and the second metal bump.

Thereafter, by the step of controlling the temperatures of the first semiconductor substrate and the second semiconductor substrate to a temperature lower than the solidus temperature of the low melting point metal, the melt of the low melting point metal solidifies, so that the first metal bump and the second metal bump are electrically and mechanically bonded through the low melting point metal.

Similar is the case in which low melting point metal layers are formed respectively on the top portions of both of the first metal bump and the second metal bump.

The form of the semiconductor substrate can be, for example, a semiconductor chip (main chip, sub-chip) or a semiconductor wafer from which semiconductor chips are to be cut out. The metal bump can be formed of gold (Au), and the low melting point metal layer can be formed of, for example, a solder of tin, a tin-lead alloy, a tin-silver-copper alloy, or indium. The second temperature may be room temperature.

The abovementioned advantages can be more easily obtained when the difference between the first temperature and the second temperature is somewhat large. Therefore, the difference between the first temperature and the second temperature can be, for example, 100° C. or more. Further, the difference between the first temperature and the second temperature may be 200° C. or more.

The abovementioned substrate temperature controlling step may includes an oppositely disposing step for disposing the first semiconductor substrate and the second semiconductor substrate substantially horizontally and in a vertically opposed state.

By the oppositely disposing step, the first semiconductor substrate and the second semiconductor substrate are disposed substantially horizontal and vertically opposed to each other. At the metal bump approaching step, the first semiconductor substrate and the second semiconductor substrate can be brought to be close to each other with keeping this state. In this case, the melt of the low melting point metal is sandwiched between the first metal bump and the second metal bump in the vertical direction. Therefore, the melt of the low melting point metal is hard to flow out from between the first metal bump and the second metal bump.

The low melting point metal layers are formed on the top portion of the second metal bump, and therefore it is not always necessary to form the low melting point metal layers on the top portion of the first metal bump respectively.

With such a structure, at the substrate temperature controlling step, the temperature of the second semiconductor substrate is lower than the solidus temperature of the low melting point metal, and therefore the low melting point metal layer does not melt. On the other hand, at the substrate temperature controlling step, the temperature of the first metal bumps is made to be higher than the solidus temperature of the low melting point metal. And when the first metal bump comes into contact with the low melting point metal layer formed on the second metal bump by the metal bump approaching step, a portion of low melting point metal layer adjacent to the contact portion is heated by the first metal bump to a temperature higher than the solidus temperature of the low melting point metal, and thereby a melt of the low melting point metal is produced.

Thereafter, by the step of cooling the first semiconductor substrate and the second semiconductor substrate to a temperature lower than the solidus temperature of the low melting point metal, the melt of the low melting point metal solidifies, so that the first metal bump and the second metal bump are electrically and mechanically bonded together through the low melting point metal layer.

At this time, by the metal bump approaching step, low melting point metal layer formed on the second metal bump melts only in its contact portion with the first metal bump and its portion adjacent thereto. Therefore, the melt of the low melting point metal is prevented from flowing from between the first metal bump and the second metal bump. In such a manner, the first metal bump and the second metal bump can be suitably bonded. It is preferable that the area of the first metal bump is smaller than that of the second metal bump when seen in the direction perpendicular to the first and second semiconductor substrates and the first metal bump and the second metal bump are bonded with the first metal bump being completely superposed on the second metal bump. In this case, the contact portion of the first metal bump with the low melting point metal layer becomes small with respect to the whole area of the low melting point metal layer, and the abovementioned advantages can be remarkably obtained.

The first semiconductor substrate may be a semiconductor chip, and in this case, the second semiconductor substrate may be a semiconductor wafer.

The semiconductor wafer can include a number of (e.g. thousands of) regions each corresponding to a semiconductor chip.

With this arrangement, the semiconductor chips can be bonded onto the wafer. At the substrate temperature controlling step, the temperature of the semiconductor wafer as the second semiconductor substrate is controlled to the second temperature, namely, a low temperature lower than the melting point of the low melting point metal. Consequently, for example, if the semiconductor wafer is kept at the second temperature for a long time required for bonding thousands of semiconductor chips onto the semiconductor wafer, the characteristics of the semiconductor wafer are hard to be degraded.

After all of the semiconductor chips are bonded onto the semiconductor wafer, the semiconductor chips can be cut out from the semiconductor wafer. Thereby, the first and the second semiconductor chips each having a Chip-On-Chip structure can be obtained. In such a method for manufacturing a semiconductor device, bonding of the semiconductor chips is carried out with one semiconductor chip being at level of a semiconductor wafer, so that a high productivity can be obtained.

A method for manufacturing a semiconductor device according to a second aspect of the present invention is a method for manufacturing a semiconductor device having a structure in which a first metal bump formed on a surface of a first semiconductor substrate and a second metal bump formed on a surface of second semiconductor substrate are bonded together. This method includes a step of forming a layer of a low melting point metal on a top portion of at least either of the first metal bump and the second metal bump, a flux applying step for applying flux on the top portion of at least either of the first metal bump and the second metal bump, a temporarily fixing step for opposing, after the flux applying step, the surface of the first semiconductor substrate and the surface of the second semiconductor substrate to each other and temporarily fixing the first metal bump and the second metal bump to each other through the flux to each other, and a heating step for heating, after the temporarily fixing step, the first semiconductor substrate and the second semiconductor substrate to a temperature higher than the solidus temperature of the low melting point metal.

According to the present invention, the first metal bump and the second metal bump are bonded through the flux as an insulator. Therefore, if one of the first and second semiconductor substrates is electrically charged, no electrical discharge occurs at the time of this temporarily fixing, and so the functional elements provided on the other semiconductor substrate are not electrostatically damaged. Consequently, the first and the second semiconductor substrates need not be provided with any protective diode for preventing electrostatic damage from occurring at the time of bonding.

After temporarily fixing the first metal bump and the second metal bump, the first and the second semiconductor substrates are heated to a temperature higher than the solidus temperature of the low melting point metal, so that a melt of the low melting point metal is produced.

Then, by cooling the first and the second semiconductor substrates to a temperature lower than the solidus temperature of the low melting point metal, the first metal bump and the second metal bump are electrically and mechanically bonded together through the low melting point metal layer. At this time, if oxide films are formed on the surfaces of the first and the second metal bumps, the oxide films are removed by the action of the flux and the melt of the low melting point metal has a high wettability with respect to the first and the second metal bumps. Consequently, the first metal bump and the second metal bump can be suitably bonded together through the low melting point metal layer.

The first and the second metal bumps may be formed of, for example, gold (Au), and the low melting point metal layer may be formed of, for example, tin (Sn).

The abovementiond heating step may be carried out in a substantially unloaded state in which no load for pressing the first and the second semiconductor substrates against each other is applied on the first or second semiconductor substrates.

With this arrangement, the first and the second semiconductor substrates are heated in a substantially unloaded state in which, for example, one of the first and the second semiconductor substrates is horizontally placed and the other semiconductor substrate is mounted thereon. In this state, the upper semiconductor substrate is pressed against the lower semiconductor substrate only by its own weight and the first and the second semiconductor substrates are not compulsorily pressed against each other by any outer load, so that they can move relative to each other. Therefore, if the first metal bump and the second metal bump are temporarily fixed in the state of somewhat out of alignment or with some displacement by the temporarily fixing step, the first metal bump and the second metal bump move (self-align) so as to reduce such a displacement due to the surface tension of the melt of the low melting point metal when the melt is produced by the heating step. Therefore, the first metal bump and the second metal bump can be bonded together with a reduced displacement.

Further, since a step of applying a load on the first and the second semiconductor substrates can be omitted, a high productivity can be obtained.

The temporarily fixing step may include a step of temporarily fixing a plurality of first semiconductor substrates onto the surface of the second semiconductor substrate.

With this arrangement, after the plurality of first semiconductor substrates are temporarily fixed onto the surface of the second semiconductor substrate, the first and the second semiconductor substrates can be heated as a lump. That is, it is not necessary to repeat heating and cooling as many times as the number of the sub-chips. Consequently, the second semiconductor substrate and the plurality of first semiconductor substrates are bonded as a lump, so that a high productivity can be obtained.

The first semiconductor substrate may be, for example, a semiconductor chip and the second semiconductor substrate may be, for example, a semiconductor wafer. In this case, after the first and the second semiconductor substrates are bonded together, the second semiconductor substrate can be cut into pieces of semiconductor chips each having a Chip-On-Chip structure.

The abovementioned and other objects, features and advantages of the present invention will become more apparent from the following explanation given with reference to the appended drawings.

THE DESCRIPTION OF THE PREFERRED EMBODIMENTS

Figure 1:
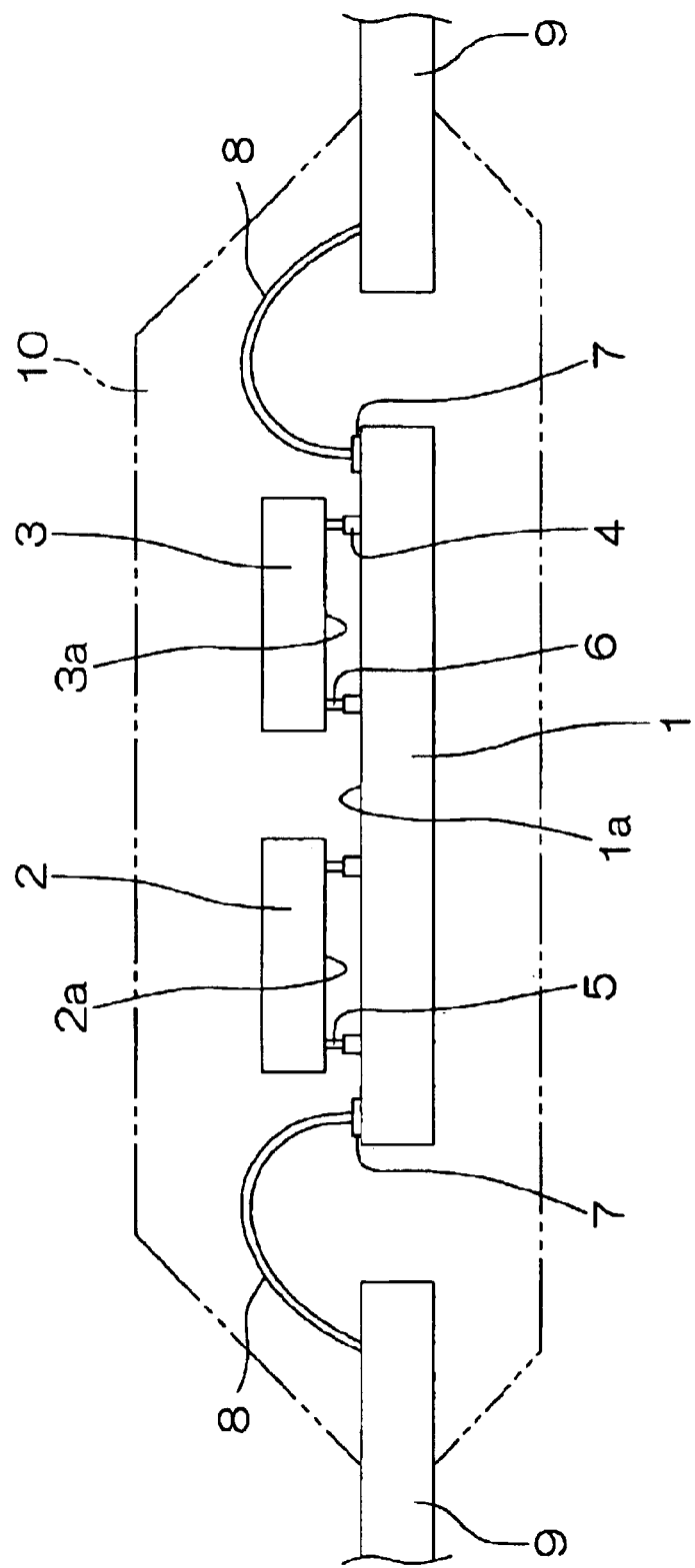
FIG. 1 is a schematic front view of a semiconductor device obtained by a method for manufacturing a semiconductor device according to the first embodiment of the present invention.

FIG. 1 is a schematic front view of a semiconductor device obtained by a manufacturing method according to a first embodiment of the present invention.

This semiconductor device has so-called a Chip-On-Chip structure in which a sub-chip 2 and a sub-chip 3 as a first semiconductor substrate and a main chip 1 as a second semiconductor substrate are stacked and bonded. The sub-chips 2, 3 are smaller than the main chip 1.

The opposed surfaces of the main chip 1 and the sub-chips 2, 3 are active surfaces 1a, 2a, 3a on which functional elements, wirings and the like are provided respectively. A plurality of metal bumps 4 are provided on the active surface 1a of the main chip 1. The metal bumps 4 are formed of gold (Au). On parts of the active surface 1a near the periphery thereof and unopposed by the active surfaces 2a, 3a, outer connecting electrodes 7 are provided.

Metal bumps 5, 6 are provided on the active surfaces of the sub-chips 2, 3 in positions corresponding to the metal bumps 4 respectively. The metal bumps 5, 6 are formed of gold (Au). A thin layer formed of tin (Sn) is provided between each metal bump 4 and each metal bump 5 or each metal bump 6 (not shown). Each metal bump 4 and each metal bump 5 or each metal bump 6 is bonded through the thin tin layer.

Laterally extending lead frame 9 are provided by the sides of the main chip 1 with being spaced from the main chip 1. The outer connecting electrodes 7 and the lead frame 9 are connected by bonding wires 8. A region including the main chip 1, the sub-chips 2, 3, the bonding wires 8 and connecting portions between the bonding wires 8 and the lead frames 9 is protected by a sealing resin 10 (shown by a chain double-dashed line in FIG. 1).

Figure 2A:
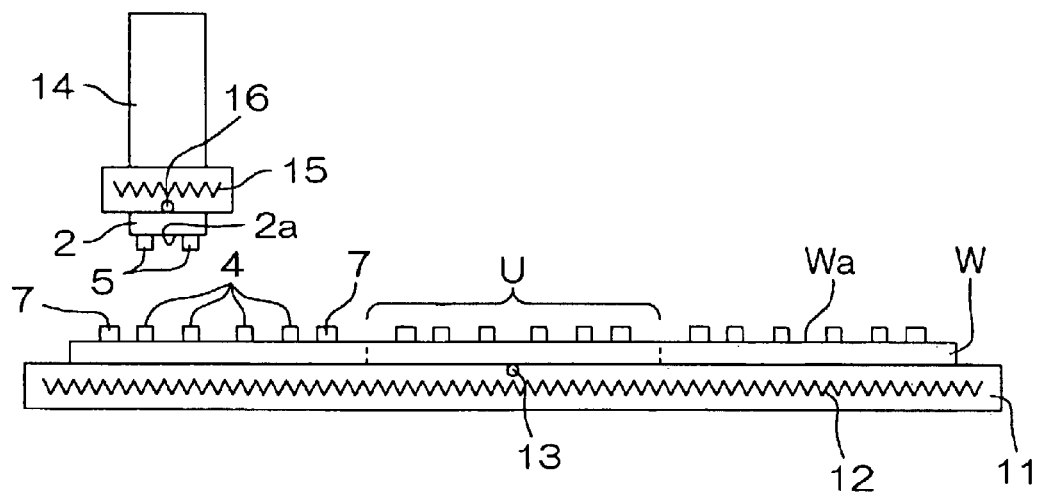
FIGS. 2(*a*), 2(*b*) and 2(*c*) are schematic front views for explaining the method for manufacturing the semiconductor device shown in FIG. 1.
Figure 2B:
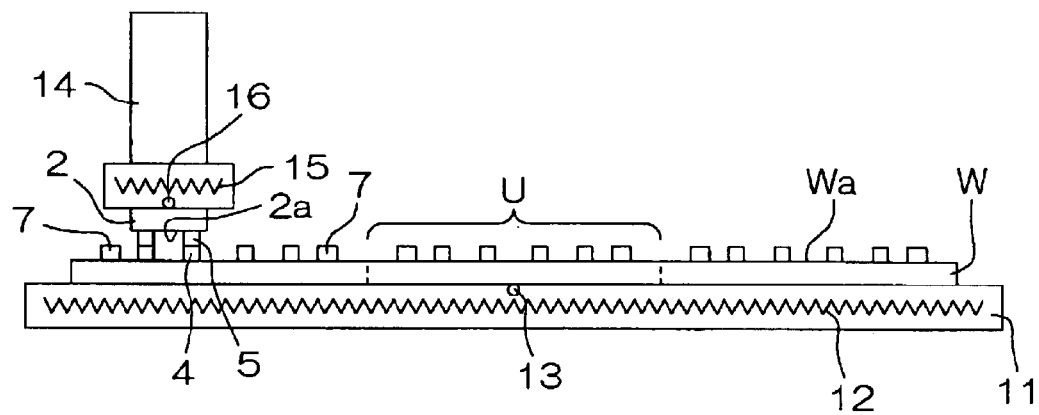
Figure 2C:
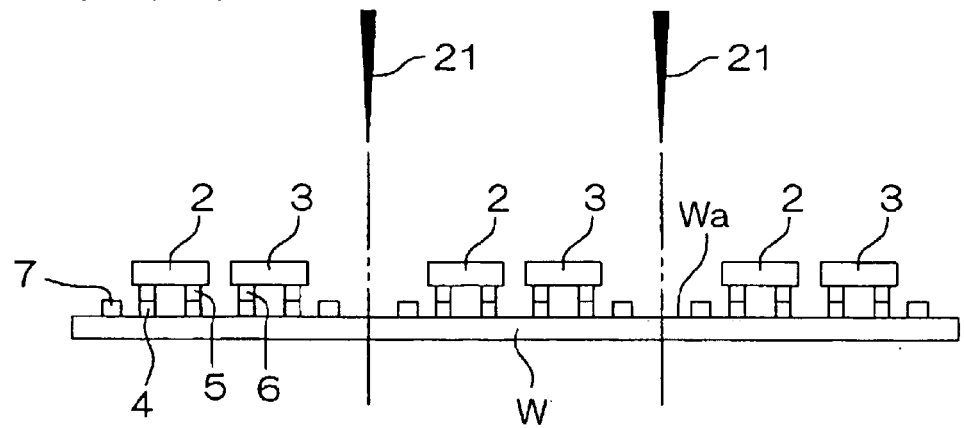
Figure 3A:
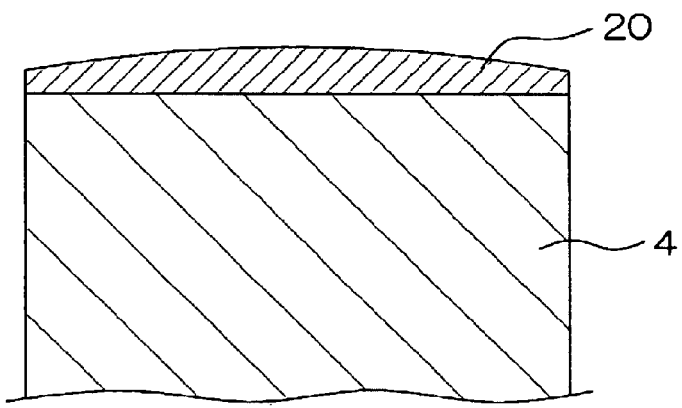
FIGS. 3(*a*) and 3(*b*) are enlarged sectional views of portions adjacent to metal bumps of FIGS. 2(*a*) and 2(*b*) respectively.
Figure 3B:
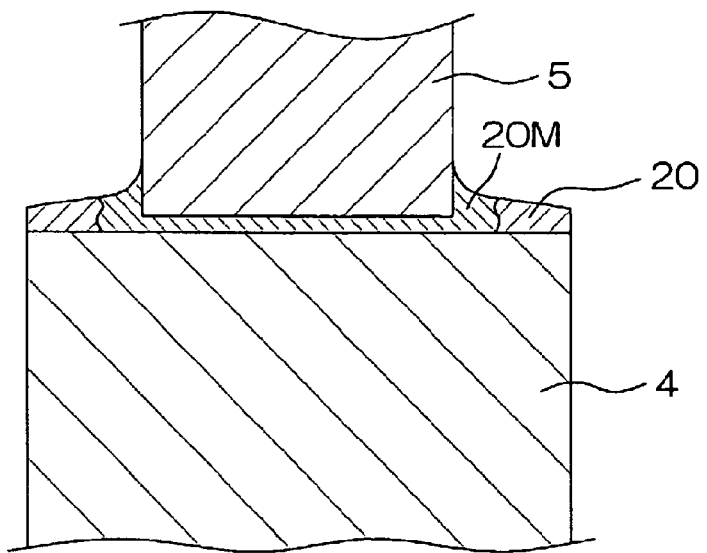

FIGS. 2(a) to 2(c) are schematic front views for explaining a method for manufacturing a semiconductor device shown in FIG. 1, and FIGS. 3(a) and 3(b) are enlarged sectional views showing portions adjacent to the metal bumps 4, 5. FIG. 3(a) corresponds to FIG. 2(a) and FIG. 3(b) corresponds to FIG. 2(b).

First, a semiconductor wafer w (hereinafter referred to as "wafer W" only) is placed substantially horizontally on a platform 11 (FIG. 2(a)). The wafer W includes a number of (e.g. thousands of) unit regions U each corresponding to the main chip 1 (boundaries between adjacent unit regions U are shown by broken lines in FIGS. 2(a), 2(b)). One surface of the wafer W is an active surface Wa corresponding to the active surface 1a, and metal bumps 4 are provided on the active surface Wa.

The top portion of each metal bump 4 is a substantially flat plane, on which a tin layer 20 is formed (FIG. 3a). The wafer W is placed on the platform 11 with the active surface Wa being faced upward.

Provided inside the platform 11 are a heater 12 and a heat sensor 13, and the wafer W can be heated according to the output of the heat sensor 13 to a predetermined temperature.

Then, the surface on the opposite side of the active surface 2a of a sub-chip 2 is absorbed by a vacuum collet 14 so that the sub-chip 2 is substantially horizontally placed opposed to the wafer W with the active surface 2a thereof being faced downward (FIG. 2(a)). The top portion of each metal bump 5 has a substantially flat surface. The surface of the metal bump 5 has no tin layer thereon. The width of the metal bump 5 is smaller than that of the metal bump 4 (FIG. 3(a)) and the area of the metal bump 5 is smaller than that of the metal bump 4 when seen in the direction perpendicular to the active surfaces 1a, 2a.

The vacuum collet 14 can absorb the sub-chip 2, for example, by vacuum absorption. Inside the vacuum collet 14, a heater 15 and a heat sensor 16 are provided adjacent to the surface coming into contact with the sub-chip 2. The sub-chip 2 absorbed by the vacuum collet 14 can be heated to a predetermined temperature by the heater 15 according to an output of the heat sensor 16.

Then, the sub-chip 2 is heated by the heater 15 to a first temperature T1 higher than the melting point 232° C. of tin, and the wafer W is heated by the heater 12 to a second temperature T2 lower than the melting point 232° C. of tin. The difference ΔT between the first temperature T1 and the second temperature T2 can be, for example, 100° C. The difference ΔT between the first temperature T1 and the second temperature T2 may be, for example, 200° C.

In such a state, the metal bumps 5 of the sub-chips 2 and the corresponding metal bumps 4 of the wafer W are positioned in alignment and the vacuum collet is lowered, thereby to bond the metal bumps 4 and the metal bumps 5 together (FIG. 2(b)). At this time, the metal bump 4 is substantially completely superposed on the metal bump 5 when seen in plan view (seen in the direction perpendicular to the active surfaces 1a, 2a).

At this time, since the tin layer 20 comes into contact with the metal bump 5 having the first temperature T1 higher than the melting point of tin, a part of the tin layer adjacent to the contacting portion has a temperature higher than the melting point of tin and melts (in FIG. 3(b), the molten part of the tin layer 20 being indicated by numeral 20M). At the same time, the metal bump 5 is cooled by the metal bump 4 and the temperature of the metal bump 5 is lowered. Thereafter, the sub-chip 2 is separated from the vacuum collet 14. As a result, no heat is given to the sub-chip 2, so that the heat of the metal bump 5 and the molten tin layer 20 is promptly taken away by the metal bump 4.

Therefore, the temperature of the sub-chip 2 becomes lower than the melting point of tin and the molten tin layer 20 is solidified. Thereby, the metal bump 4 and the metal bump 5 are mechanically and electrically bonded.

Since the tin layer 20 melts only in a portion thereof adjacent to the limited portion in contact with the metal bump 5, the molten tin layer 20 is prevented from flowing out from between the metal bump 4 and the metal bump 5 when the metal bump 4 and the metal bump 5 come close to (or into contact with) each other. In other words, the first temperature T1 and the second temperature T2 are set at such temperatures that the tin layer 20 can sufficiently melt and the molten tin layer 20 can be prevented from flowing out.

For example, if the first temperature T1 and the second temperature T2 are excessively low, the metal bump 5 is cooled to a temperature not more than the melting point of tin immediately after it comes into contact with the tin layer 20 and therefore the tin layer 20 cannot sufficiently melt. Consequently, a large bonding strength between the metal bump 4 and the metal bump 5 cannot be obtained. Further, if the first temperature T1 and the second temperature T2 are excessively high, a large amount of heat is given to the tin film 20 by the time the temperature of the metal bump 5 becomes lower than the melting point of tin when the metal bump 5 comes into contact with the tin layer 20, so that the whole of the tin layer 20 melts and flows out from between the metal bump 4 and the metal bump 5.

As mentioned above, in order to melt only a portion of the tin layer 20 adjacent to the portion in contact with the metal bump 5, it is preferable that the difference ΔT between the first temperature T1 and the second temperature T2 is rather large. The first temperature T1 and the second temperature T2 are determined with taking these facts into consideration.

Thereafter, the sub-chip 3 is bonded to the wafer W. The top portion of each metal bump 6 of the sub-chip 3 has a substantially flat surface. The surface of the metal bump 6 has no tin layer thereon. The width of the metal bump 6 is smaller than that of the metal bump 4 and the area of the metal bump 6 is smaller than that of the metal bump 4 when seen in the direction perpendicular to the active surfaces 1a, 3a. The sub-chip 3 is bonded to the wafer W in the similar manner to the case of the sub-chip 2.

In such a manner, a wafer W can be obtained in which the sub-chips 2, 3 are bonded in a unit region U. Similarly, the sub-chips 2, 3 are bonded in all of the unit regions U of the wafer W.

At this time, the sub-chips 2, 3 are heated to a temperature higher than the melting point of tin (the first temperature T1) only for a while they are bonded to the wafer W. Further, the wafer W is heated while the sub-chips 2, 3 are bonded in all of the unit regions U to the second temperature T2 lower than the melting point of tin. Therefore, The characteristics of the wafer W (main chip 1) and the sub-chips 2, 3 are hardly degraded.

Thereafter, as shown in FIG. 2(c), the wafer W is cut along boundaries between adjacent unit regions U by a dicing saw 21, so that main chips 1 to which sub-chips 2,3 are bonded are cut out of the wafer W. Further, after the outer connecting electrodes 7 and the lead frame 9 are connected by the bonding wires 8, the sealing resin 10 is molded surrounding the main chip 1, sub-chips 2, 3 and the like, and thereby a semiconductor device shown in FIG. 1 is obtained.

In the abovementioned manufacturing method, since the sub-chips 2, 3 are bonded to the main chip 1 being at a level of a wafer W, a high productivity can be obtained.

In the abovementioned manufacturing method, the wafer W need not be heated (that is, the wafer W may be at room temperature) as long as the tin layer 20 can sufficiently melt.

Instead of being formed on the metal bumps 4 of the main chip 1, the tin layers 20 may be formed on the metal bumps 5, 6 of the sub-chips 2, 3. Further, the tin layers 20 may be formed on both of the metal bumps 4 and the metal bumps 5, 6. In this case, the sub-chips 2, 3 are heated to the first temperature T1 by a heater 15 of the vacuum collet 14, and thereby the tin layer 20 melts. When the molten tin layer 20 then comes into contact with the metal bump 4 having the second temperature T2, the heat of the molten tin layer 20 is taken away by the metal bump 4 and it rapidly solidifies, to be prevented from flowing from between the metal bump 4 and the metal bump 5 or 6. If the melt of the tin layer 20 does not completely solidified, it becomes hard to flow by being cooled.

It is possible that the tin layers 20 are formed on a part of the metal bumps 5 and a part of the metal bumps 6 and at the same time on the metal bumps 4 corresponding to the metal bumps 5, 6 each having no tin layer 20 thereon.

Further, it is possible that the wafer W is cut before the sub-chips 2, 3 are bonded to the wafer W and the sub-chips 2, 3 are bonded to the main chip 1. In this case, it is possible that the main chip 1 is at the first temperature T1 and the sub-chips 2, 3 are at the second temperature T2. Since the time required for bonding the two sub-chips 2, 3 to the main chip 1 is short, the characteristics of the main chip 1 is hardly degraded if the main chip 1 is heated to the first temperature T1.

Figure 4:
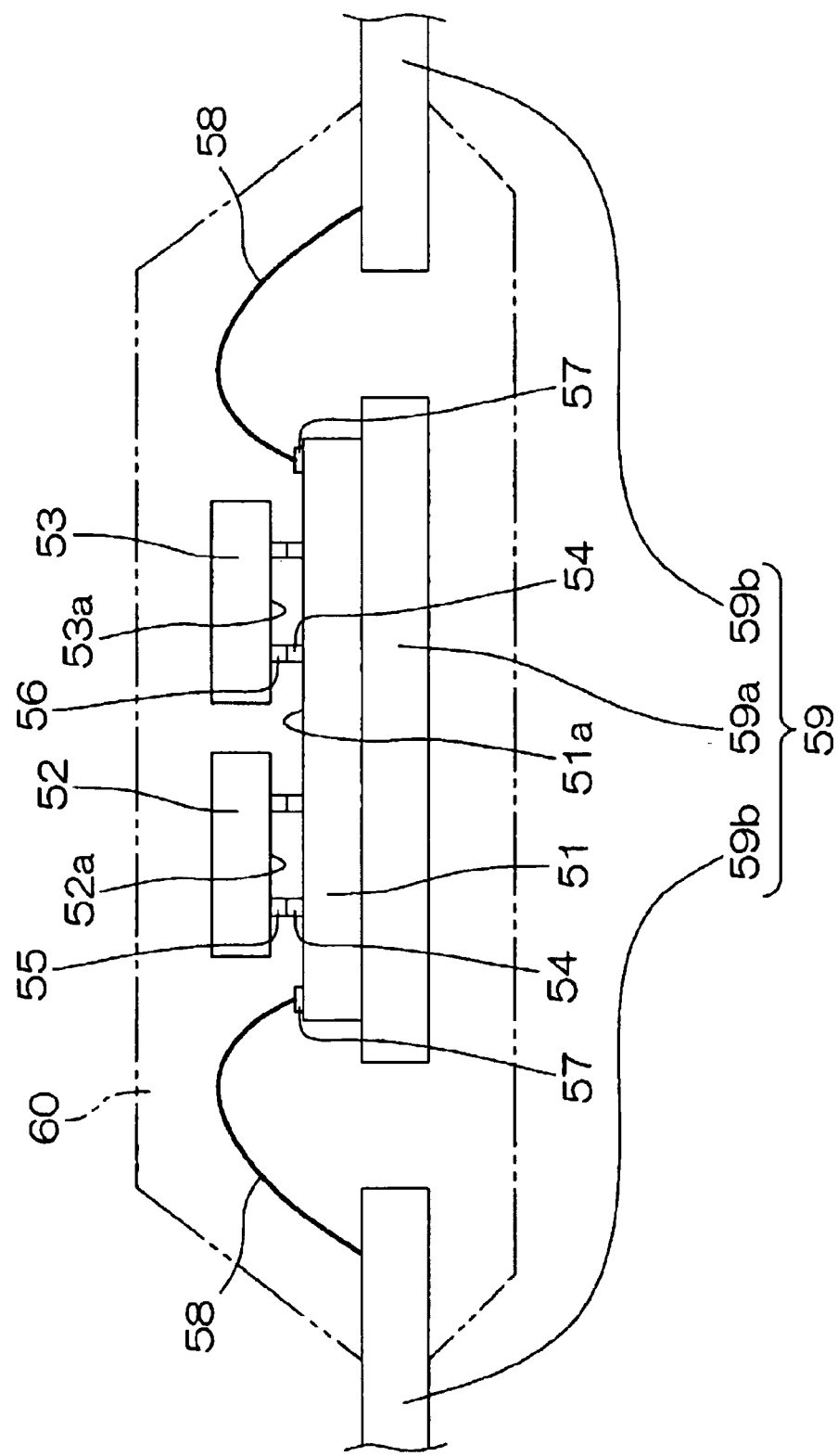
FIG. 4 is a schematic front view of a semiconductor device obtained by a method for manufacturing a semiconductor device according to the second embodiment of the present invention.

FIG. 4 is a schematic front view of a semiconductor device obtained by the manufacturing method according to the second embodiment of the present invention.

This semiconductor device has so-called a Chip-On-Chip structure in which a sub-chip 52 and a sub-chip 53 as a first semiconductor substrate and a main chip 51 as a second semiconductor substrate are stacked and bonded. The sub-chips 52, 53 are smaller than the main chip 51.

The opposed surfaces of the main chip 51 and the sub-chips 52, 53 are active surfaces 51a, 52a, 53a on which functional elements, wirings and the like are formed, respectively. A plurality of metal bumps 54 are provided on the active surface 51a of the main chip 51. The metal bumps 54 are formed of gold (Au). On parts of the active surface 51a near the periphery thereof and unopposed by the active surfaces 52a, 53a, outer connecting electrodes 57 are provided.

Metal bumps 55, 56 are provided on the active surfaces 52a, 53a of the sub-chips 52, 53 at the positions corresponding to the metal bumps 54. The metal bumps 55, 56 are formed of gold (Au). A thin layer formed of tin (Sn) is provided between each metal bump 54 and each metal bump 55 or each metal bump 56 (not shown). Each metal bump 54 and each metal bump 55 or each metal bump 56 are bonded through the tin layer.

Each of the main chip 51, the sub-chips 52, 53 are not provided with a protective diode (diode connected to each of the metal bumps 54, 55, 56) for protecting the elements formed on the main chip 51, and the sub-chips 52, 53 from electrostatic discharge damage. Therefore, the main chip 51, and the sub-chips 52, 53 can be provided with more other functional elements in comparison with a semiconductor chip provided with a protective diode.

The surface of the main chip 51 on the opposite side of the active surface 51a is bonded to a supporting portion (island) 59a of the lead frame 59. Laterally extending lead terminal portions 59b of the lead frame 59 are provided by the sides of the supporting portion 59a with being spaced from the supporting portion 59a respectively. The outer connecting electrodes 57 and the lead terminal portions 59b are connected by bonding wires 58 respectively. A region including the main chip 51, the sub-chips 52, 53, the supporting portion 59a, the bonding wires 58 and connecting portions between the bonding wires 58 and the lead terminal portion 59b is protected by a sealing resin 60 (shown by a chain double-dashed line in FIG. 4).

Figure 5A:
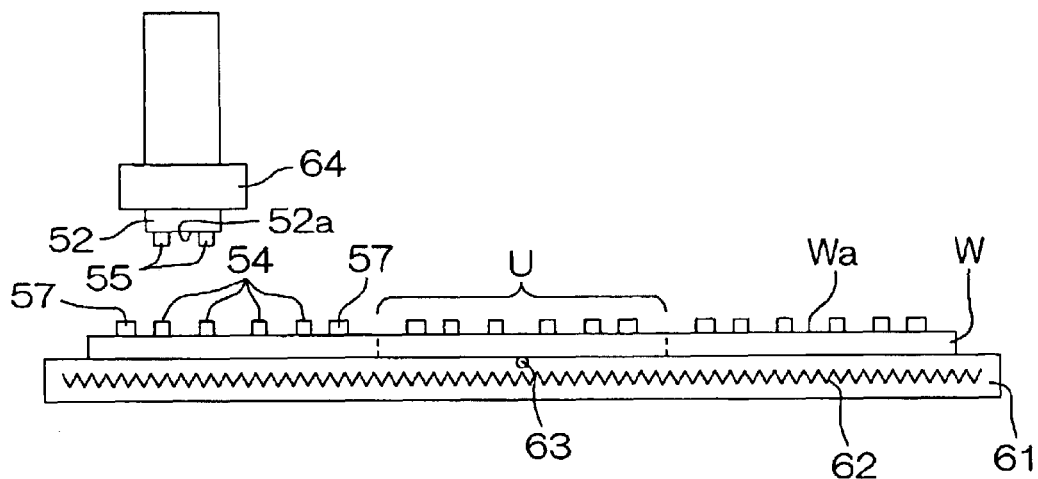
FIGS. 5(*a*), 5(*b*) and 5(*c*) are schematic front views for explaining the method for manufacturing the semiconductor device shown in FIG. 4.
Figure 5B:
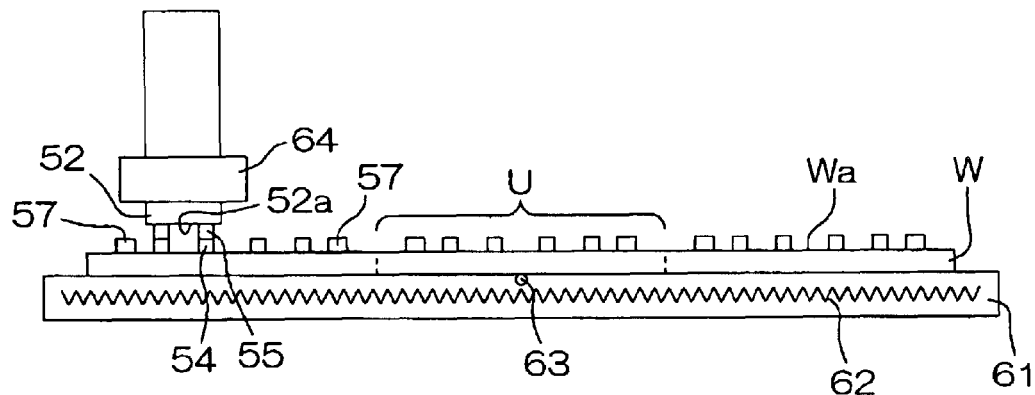
Figure 5C:
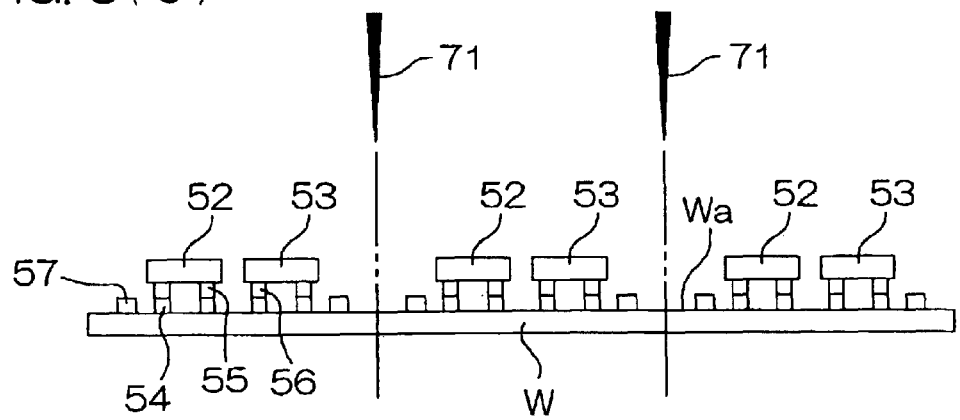
Figure 6A:
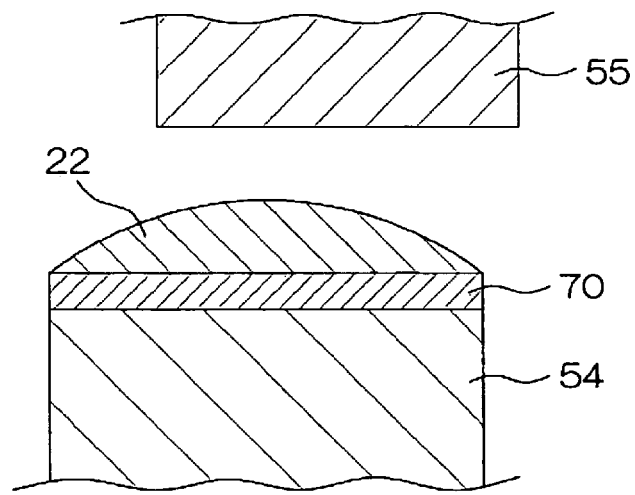
FIGS. 6(*a*), 6(*b*) and 6(*c*) are enlarged sectional views of portions adjacent to metal bumps of FIGS. 5(*a*), 5(*b*) and 5(*c*) respectively.
Figure 6B:
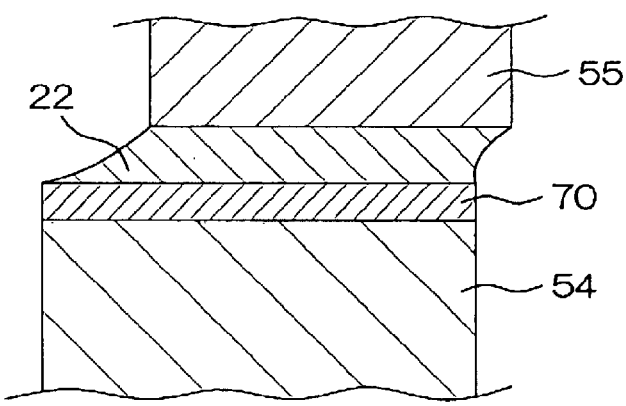

FIGS. 5(a) to 5(c) are schematic front views for explaining a method for manufacturing a semiconductor device shown in FIG. 4, and FIGS. 6(a) and 6(b) are enlarged sectional views showing portions adjacent to the metal bumps 54, 55. FIG. 6(a) corresponds to FIG. 5(a) and FIG. 6(b) corresponds to FIG. 5(b).

The wafer W used for manufacturing such a semiconductor device includes a number of (e.g. thousands of) unit regions U each corresponding to the main chip 1 (boundaries between adjacent unit regions U are shown by broken lines in FIGS. 5(a), 5(b)). The active surface Wa of the wafer W corresponds to the active surface 51a of the main chip 51. Metal bumps 54 are provided on the active surface Wa. The top portion of each metal bump 54 has a substantially flat surface, on which a tin layer 70 is preliminarily formed (see FIG. 6(a)).

First, flux 22 is applied on the top portion of the metal bump 54 formed on the active surface Wa of the wafer W by dipping, transferring or the like. Then, the wafer W is put on a platform 61 with the active surface Wa being faced upward. Provided inside the platform 61 are a heater 62 and a heat sensor 63, and the wafer W on the platform 61 can be heated according to the output of the heat sensor 63 to a predetermined temperature.

Then, as shown in FIG. 5(a), the surface on the opposite side of the active surface 52a of a sub-chip 52 is absorbed by a vacuum collet 64 so that the sub-chip 52 is positioned opposed to the wafer W with the active surface 52a thereof being faced downward in the substantially horizontal state.

The top portion of each metal bump 55 has a substantially flat surface. The surface of the metal bump 55 has no tin layer thereon (see FIG. 6(a)). The vacuum collet 64 can absorb the sub-chip 52, for example, by vacuum absorption.

In this state, the metal bumps 55 of the sub-chips 52 and the corresponding metal bumps 54 of the wafer W are positioned in alignment, and the vacuum collet 64 is lowered. At this time, as shown in FIG. 6(a), the metal bump 54 and the metal bump 55 may be somewhat out of alignment. When the metal bumps 54 and the metal bumps 55 are made to come close to each other to some extent, the lowering speed of the sub-chip 52 is reduced.

Then, after the lower end of the metal bump 55 comes into contact with the surface of the flux 22, the lowering operation of the sub-chip 52 is stopped before the metal bump 55 comes into contact with the tin layer 70 (see FIGS. 5(b), 6(b)), and the sub-chip 52 is separated from the vacuum collet 64 and mounted on the wafer W. Thereby, the metal bump 55 comes into a state of being temporarily fixed to the metal bump 54 through flux 22.

It is preferable that, in such a manner, the sub-chip 52 is not pressed against the wafer W by the vacuum collet 64 and no load is applied on the wafer W and the sub-chip 52. Thereby, the wafer W and the sub-chip 52 can be prevented from being broken. No problem is caused if a little load is applied on the wafer W and the sub-chip 52.

In the abovementioned process, for example, the sub-chip 52 before being temporarily fixed is sometimes electrically charged. However, since the metal bump 54 and the metal bump 55 in the temporarily fixed state are electrically insulated from each other by the flux 22 serving as an insulator, no electric discharge occurs from the sub-chip 52 to the wafer W. Therefore, even if no protective diode is connected to the metal bump 54 of the wafer W (main chip 51) and the metal bump 55 of the sub-chip 52, the functional elements provided on the wafer W (main chip 51) are not electrostatically damaged.

Thereafter, similarly to the case of the sub-chip 52, the sub-chip 53 is temporarily fixed to the wafer W. The top portion of the metal bump 56 of the sub-chip 53 has, similar to the metal bump 55 of the sub-chip 52, a flat surface, on which no tin layer is provided.

In such a manner, the wafer W to which the sub-chips 52, 53 are temporarily fixed in one unit region U can be obtained. Similarly, the sub-chips 52, 53 are temporarily fixed in all of the unit regions U in the wafer W. In this state, the wafer W is loaded only by the weights of the sub-chips 52, 53, and the wafer W and the sub-chips 52, 53 are substantially unloaded. The abovementioned steps are carried out at ordinary temperature.

Next, the wafer W is heated to a temperature higher than the melting point of tin (for example, higher than 240° C.) for a predetermined time by the heater 62 provided in the platform 61. Thereby, the tin layer 70 melts and solidifies, so that the metal bumps 55, 56 of all of the sub-chips 52, 53 are bonded to the metal bumps 54 of the wafer W through the tin layers 70 respectively. At this time, if oxide films are formed on the surfaces of the metal bumps 54, 55, 56, the oxide films are removed away by the action of the flux 22 and the surfaces of the metal bumps 54, 55, 56 have high wettability with respect to the melt of tin, so that the metal bumps 54 and the metal bumps 55, 56 can be suitably bonded together through the tin layers 70 respectively.

Figure 6C:
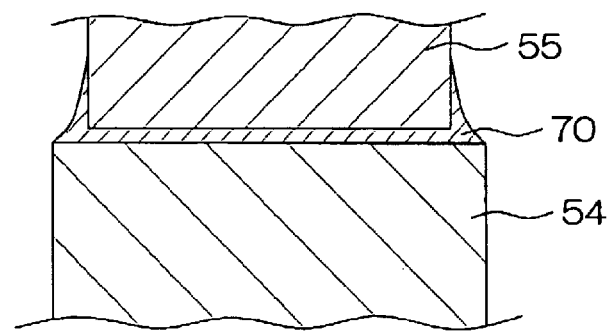

Further, since the wafer W and the sub-chips 52, 53 are substantially unloaded, the sub-chips 52, 53 can change their positions relative to the wafer W. Therefore, when the metal bumps 55, 56 are out of alignment or displaced with respect to the metal bumps 54, the metal bumps 54 and the metal bumps 55, 56 move (self-align) so as to reduce such displacement (FIG. 6(c)) by a surface tension of the melt of tin. So, the wafer W (main chip 51) and the sub-chips 52, 53 can be bonded with reduced displacement.

Thereafter, the wafer W is washed, and the residue of the flux 22 is removed. Then, as shown in FIG. 5(c), the wafer W is cut by a dicing saw 71 along the boundaries between adjacent unit regions U, so that the main chips 51 to which the sub-chips 52, 53 are bonded are cut out of the wafer W.

Further, after a surface of the main chip 51 on the opposite side of the active surface 51a is bonded to the supporting portion 59a and the outer connecting electrodes 57 and the lead terminal portions 59b are connected together by the bonding wires 58, the sealing resin 60 is molded surrounding the main chip 51, sub-chips 52, 53 and the like, and thereby a semiconductor device shown in FIG. 4 is obtained.

In the abovementioned method for manufacturing a semiconductor device, the main chips 51 and the sub-chips 52, 53 are bonded together in a lump by heating the wafer W to which the sub-chips 52, 53 are temporarily fixed in all of the unit regions U thereof, so that a high productivity can be obtained. Further, in a conventional manufacturing method, a wafer and the like are apt to be damaged because as many times as the number of sub-chips of load-applying and heating are repeated with respect to the wafer. However, in the abovementioned manufacturing method, such a problem does not occur.

Instead of being formed on the metal bumps 54 of the main chip 51, the tin layers 70 may be formed on the metal bumps 55, 56 of the sub-chips 52, 53. Further, the tin layers 70 may be formed on both of the metal bumps 54 and the metal bumps 55, 56. Instead of being applied on the metal bump 54 of the main chip 51, the flux 22 may be applied on the metal bumps 55, 56 of the sub-chips 52, 53. Further, the flux 22 may be applied on both of the metal bumps 54 and the metal bumps 55, 56.

It is possible that the flux 22 is applied on a part of the metal bumps 55 and a part of the metal bumps 56 and at the same time on the metal bumps 54 corresponding to the metal bumps 55, 56 having no flux thereon.

Further, it is possible that the wafer W is cut before the sub-chips 52, 53 are bonded to the wafer W, and the sub-chips 52, 53 are bonded to the main chip 51.

In the abovementioned methods for manufacturing a semiconductor device according to the first and second embodiments of the present invention, for example, if it is not necessary to strictly control the temperature of the wafer W and the sub-chips 2, 3, 52, 53, the wafer W and the sub-chips 2, 3, 52, 53 may be heated by blowing hot air thereon.

In the semiconductor device, only one sub-chip 2 (3), 52 (53) may be bonded onto a main chip 1, 51 and not less than three sub-chips may be bonded thereon. Further, another sub-chip may be bonded on the sub-chip 2(3), 52(53).

Instead of tin layer 20, 70, a layer formed of another metal having a low melting point or its alloy (solder) such as indium (In), a tin-lead based alloy, a tin-silver (Ag)-copper (Cu) based alloy or the like may be formed. In the first embodiment, if a layer of an alloy is formed instead of the tin layer 20, the first temperature can be higher than the solidus temperature of the alloy, and the second temperature can be lower than the solidus temperature of the alloy. Further, in the second embodiment, if a layer of an alloy is formed instead of the tin layer 70, the main chip 51 (wafer W) and the sub-chips 52, 53 can be heated at a temperature higher than the solidus temperature of the alloy.

The sub-chips 2, 3 (52, 53) can be bonded onto the wafer W in such a order that after the sub-chips 2 (52) are bonded in all of the unit regions U of the wafer W, the sub-chips 3 (53) are bonded in all of the unit regions U of the wafer W.

Although the present invention has been described and illustrated in detail, it is clearly understood that the same is by way of illustration and example only and is not to be taken by way of limitation, the spirit and scope of the present invention being limited only by the terms of the appended claims.

This application corresponds to the Japanese Patent Applications No.2002-225097 filed in the Japan Patent Office on Aug. 1, 2002, and No.2002-236036 filed in the Japan Patent Office on Aug. 13, 2002, and the whole disclosures of the Japanese applications are incorporated in this application by reference.

What is claimed is:

1. A method for manufacturing a semiconductor device by bonding together a first metal bump formed on a first semiconductor substrate and a second metal bump formed on a second semiconductor substrate, the method comprising:
   a low melting point metal layer forming step for forming a layer of a low melting point metal on a top portion of at least either of the first metal bump and the second metal bump;
   a substrate temperature controlling step for, controlling, with the first semiconductor substrate and the second semiconductor substrate being separated from each other, the temperature of the first semiconductor substrate to a first temperature higher than a solidus temperature of the low melting point metal and controlling the temperature of the second semiconductor substrate to a second temperature lower than a solidus temperature of the low melting point metal;
   a metal bump approaching step for bringing the first metal bump and the second metal bump close to each other after the substrate temperature controlling step; and
   a step for controlling, after the metal bump approaching step, the temperatures of the first semiconductor substrate and the second semiconductor substrate to a temperature lower than the solidus temperature of the low melting point metal.

2. A method for manufacturing a semiconductor device according to claim 1, in which the low melting point metal layer is formed on the top portion of the second metal bump and is not formed on a top portion of the first metal bump.

3. A method for manufacturing a semiconductor device according to claim 1, in which the first semiconductor substrate is a semiconductor chip and the second semiconductor substrate is a semiconductor wafer.

4. A method for manufacturing a semiconductor device according to claim 1, in which the substrate temperature controlling step includes an opposing step for disposing the first semiconductor substrate and the second semiconductor substrate substantially horizontally and in a vertically opposed state.

5. A method for manufacturing a semiconductor device according to claim 1, in which the difference between the first temperature and the second temperature at the substrate temperature controlling step is 100° C. or more.

6. A method for manufacturing a semiconductor device according to claim 1, in which the difference between the first temperature and the second temperature at the substrate temperature controlling step is 200° C. or more.

7. A method for manufacturing a semiconductor device according to claim 1, in which the area of the first metal bump is smaller than that of the second metal bump when seen in the direction perpendicular to the first and the second semiconductor substrates, and
   the first metal bump is completely superposed on the second metal bump when seen in a direction perpendicular to the first and the second semiconductor substrates at the metal bump approaching step.

8. A method for manufacturing a semiconductor device having a structure in which a first metal bump formed on a surface of a first semiconductor substrate and a second metal bump formed on a surface of second semiconductor substrate are bonded together, the method comprising:
   a step of forming a layer of a low melting point metal on a top portion of at least either of the first metal bump and the second metal bump;
   a flux applying step for applying flux on a top portion of at least either of the first metal bump and the second metal bump;
   a temporarily fixing step for opposing, after the flux applying step, the surface of the first semiconductor substrate and the surface of the second semiconductor substrate to each other and temporarily fixing the first metal bump and the second metal bump through the flux to each other; and
   a heating step for heating, after the temporarily fixing step, the first semiconductor substrate and the second semiconductor substrate to a temperature higher than the solidus temperature of the low melting point metal.

9. A method for manufacturing a semiconductor device according to claim 8, in which the heating step is carried out in a substantially unloaded state with no load pressing the first and the second semiconductor substrates against each other being applied on the first or second semiconductor substrates.

10. A method for manufacturing a semiconductor device according to claim 8, in which the temporarily fixing step includes a step of temporarily fixing a plurality of the first semiconductor substrates on the surface of the second semiconductor substrate.

11. A method for manufacturing a semiconductor device according to claim 8, in which the first semiconductor substrate is a semiconductor chip and the second semiconductor substrate is a semiconductor wafer, and
   the method further comprising a step of cutting the semiconductor wafer after the heating step.

* * * * *